United States Patent [19]
Quine

[11] 4,013,974
[45] Mar. 22, 1977

[54] MICROSTRIP BROADBAND AVALANCHE DIODE AMPLIFIER

[75] Inventor: John P. Quine, Colonie, N.Y.

[73] Assignee: General Electric Co., Schenectady, N.Y.

[22] Filed: Mar. 22, 1976

[21] Appl. No.: 669,319

[52] U.S. Cl. .................... 330/34; 330/53; 333/35; 333/84 M

[51] Int. Cl.² ...................... H03F 3/10; H03H 7/38

[58] Field of Search ................ 330/34, 53; 333/35, 333/84 M

[56] References Cited

UNITED STATES PATENTS

| | | | |
|---|---|---|---|
| 3,419,813 | 12/1968 | Kamnitsis | 330/53 X |
| 3,869,678 | 3/1975 | Mahoney | 330/53 |
| 3,961,296 | 6/1976 | Wiggenhorn | 333/84 M |

Primary Examiner—R. V. Rolinec
Assistant Examiner—Lawrence J. Dahl
Attorney, Agent, or Firm—Donald R. Campbell; Joseph T. Cohen; Jerome C. Squillaro

[57] ABSTRACT

A broadband Impatt diode amplifier for microstrip includes a two-section quarter wavelength impedance transformer. Since the width of one transformer section exceeds a half wavelength, spurious mode resonance is suppressed using a longitudinal slot with an absorbing resistor or by offsetting the transformer sections. A compact configuration combines the power of two microwave diodes over a broad frequency range.

11 Claims, 4 Drawing Figures

MICROSTRIP BROADBAND AVALANCHE DIODE AMPLIFIER

BACKGROUND OF THE INVENTION

This invention relates to microwave semiconductor device amplifiers, and more particularly to broadband avalanche diode amplifiers realized in microstrip form.

Microstrip Impatt (impact avalanche transit time) diode amplifiers as presently understood may incorporate a one-section quarter wavelength microstrip transmission line transformer to match the impedance of the output line to the diode impedance. Typically, the diode impedance is about 5 ohms while the characteristic impedance of the output line is commonly 50 ohms. Although it is known that a one-section transformer is frequency sensitive with the result that the Impatt amplifier has narrow band characteristics, the problem with the use of a broadband two-section quarter wavelength transformer is that spurious modes are observed, in particular the so-called "half-wave" resonance of the odd mode. The width dimension of the one-section transformer is less than one-half wavelength at the source frequency assuming a practical minimum value of the thickness of the microstrip dielectric substrate, so that the undesired half-wave odd mode resonance is inhibited. For the same source frequency and substrate thickness, the width of the wide section of a two-section transformer approaches or exceeds a half wavelength, with the result that occurrence of the spurious mode resonance has prevented its use. It is evident, of course, that broadband microwave semiconductor device amplifiers are needed for many applications including phased array radar and communication systems, and that microstrip circuits have the advantages of low cost and ease of fabrication.

SUMMARY OF THE INVENTION

In accordance with the invention, spurious mode resonance that can occur in a two-section microstrip quarter wavelength impedance transformer is suppressed by modifying the geometry of the broadband two-section transformer and in the principal embodiments by further including an absorbing resistor. In a modification of a single microwave semiconductor diode broadband amplifier, the power from two diodes is combined with broadband impedance matching and spurious mode suppression in a compact structure.

In the exemplary embodiments the microwave diode is an avalanche diode operating in the Impatt mode. One amplifier configuration includes a two-section transformer wherein each section has a width selected to match the impedance of the avalanche diode connected centrally at the edge of the second transformer section to the substantially higher impedance of the output microstrip transmission line which is coupled to the first transformer section. To suppress spurious mode resonance that can occur in the second transformer section having a width approaching or exceeding one-half wavelength, the two-section transformer includes an approximately half wavelength slot located centrally of the width dimension and an absorbing resistor bridging the slot. The optimum position for the absorbing resistor is near the center of the slot. A second single avalanche diode amplifier configuration uses an asymmetrical two-section transformer wherein the center lines of the two transformer sections are offset to cause coupling of spurious odd modes in the second section to desired propagating even modes of the first section to thereby effect suppression. The power combiner and broadband amplifier for two avalanche diodes matched as to diode impedances employs a second transformer section with a width exceeding one wavelength, the diodes being connected symmetrically at the edge of the second section. The centrally located longitudinal slot is used, as in the first amplifier configuration, with the difference that the slot is open-ended with a length of one-quarter wavelength and the absorbing resistor is mounted at the open end of the slot.

DESCRIPTION OF THE PREFERRED EMBODIMENTS

Figure 1:
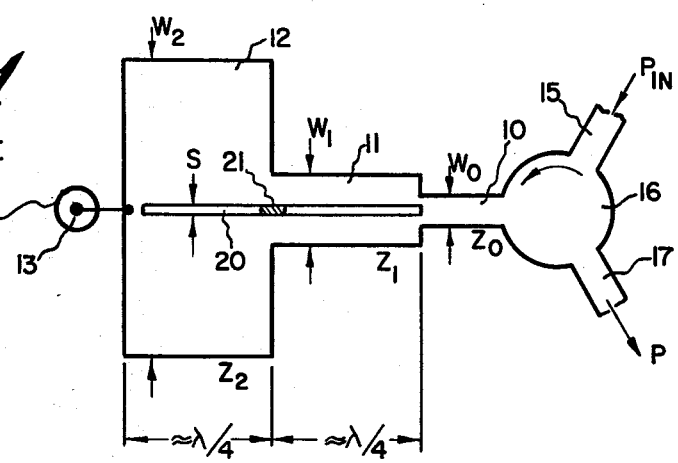
FIG. 1 is a plan view of a single Impatt diode broadband amplifier in microstrip form employing a spurious odd mode absorbing resistor.
Figure 2:
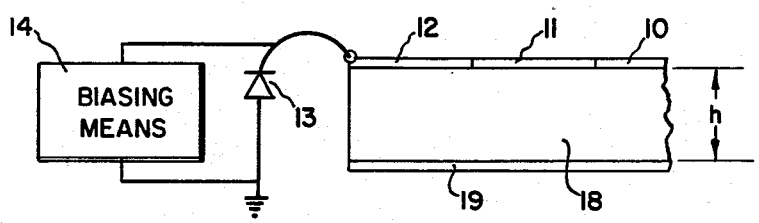
FIG. 2 is a fragmentary side view of the microstrip circuitry with the reverse biased diode shown schematically.

The single diode Impatt amplifier for microstrip illustrated in FIGS. 1 and 2 is capable of amplification at high power levels over a 10–15 percent bandwidth. Large area avalanche diodes operating in the Impatt mode require a low impedance, and the configurations here described employ two-section quarter wavelength transmission line transformers to obtain broadband impedance matching. The bandwidth provided is significantly greater than is possible using one-section microstrip transformers. The output microstrip transmission line 10 with a width $W_0$ has a predetermined characteristic impedance $Z_0$, typically 50 ohms. The two-section impedance transformer is comprised by a first transformer section 11 and a second transformer section 12, each with a length of approximately one-quarter wavelength at a selected microwave frequency, having respective widths $W_1$ and $W_2$ and corresponding characteristic impedances $Z_1$ and $Z_2$. A reverse biased Impatt diode 13 has one terminal connected centrally at the edge of the second transformer section 12 theoretically at the center line of the impedance transformer and output transmission line 10. As is known in the art, suitable biasing means 14 is provided to apply a reverse bias to diode 13. Input-output means for the amplifier can take the form, for instance, of a first transmission line 15 for transmitting input signals $P_{in}$ to a ferrite circulator 16, the isolated amplified output signals $P_{out}$ being transmitted over a second transmission line 17.

Avalanche diodes operating in the Impatt mode at present are made from gallium arsenide or silicon as a single-drift or double-drift structure. It produces a negative resistance by combining Impatt avalanche breakdown with charge-carrier transit-time effects. For further information on Impatt diodes, reference may be made to the book "Microwave Semiconductor Devices and Their Circuit Applications", edited by H. A. Watson, McGraw-Hill Book Company, New York, Copyright 1969, Library of Congress Catalog Card No. 68-17197. Also, conventional techniques can be used in the fabrication of microstrip circuitry on either major surface of a relatively thin dielectric substrate 18, using for example an aluminum oxide substrate and gold over platinum for both the amplifier components and continuous conductive ground plane 19 on the lower major substrate surface.

The two impedance transformer transmission line sections 11 and 12 having corresponding characteristic impedances $Z_1$ and $Z_2$ transform the impedance associated with output transmission line 10 from the value equal to $Z_0$ to the optimum value required for the diode load impedance, $R_d$. In a typical case, the optimum value of $R_d$ is approximately 5 ohms and $Z_0$ is 50 ohms. In this case $Z_1 = 28.117$ ohms and $Z_2 = 8.891$ ohms for a broad band match. These values of $Z_1$ and $Z_2$ require values of $W_1/h$ and $W_2/h$ of approximately 2.65 and 11.6, respectively, where $h$ is the thickness of the aluminum oxide microstrip substrate. The width dimension $W_2$ of second transformer section 12 under these conditions approaches a half wavelength in the microstrip medium at 9 GHz if $h$ has the practical minimum value of 0.020 inches, and the spurious so-called half wave resonance of the odd mode is excited as the result of slight asymmetries. To suppress the spurious half wave resonance even with a width $W_2$ which significantly exceeds a half wavelength, the two-section transformer has a longitudinal slot 20 with a length of approximately one-half wavelength located centrally of its width dimension, with an absorbing resistor 21 bridging the slot and having an optimum position at the center of the slot. The half-wave odd mode establishes in second transformer section 12 an electric field that is zero at the center line while being positive at one edge and negative at the other, and further produces transverse currents. These transverse currents are interrupted by slot 20 and dissipated by absorbing resistor 21. Analysis shows that the optimum value of absorbing resistor 21, assuming it is placed at the center of slot 20, is approximately equal to the characteristic impedance of the lowest odd-mode that is associated with the two coupled lines of width $W_2/2$ separated by a slot of width equal to S which is made much less than $W_2/2$. Assuming the same dimensions as in the above example, with $S = 0.010$ inches, the optimum value of the absorbing resistor is about 13 ohms. Various microstrip resistors can be used, such as those made of nichrome.

The use of a one-half wavelength slot without an absorbing resistor is not effective, since the odd mode resonance is not suppressed but is only shifted down in frequency. Thus, the radiation from the slot is insufficient to dampen the resonance of the odd mode, even when the slot is made on the order of a half wavelength in length. When absorbing resistor 21 has the optimum value as previously mentioned, the Q of the odd mode cavity (i.e., second transformer secton 12 and the underlying portion of the ground plane), is essentially unity. The diode 13 is only loosely coupled to the odd mode cavity because the odd mode electric field is zero at the center line where the diode is connected to the two-section transformer. In this case, the normalized coupling, i.e., the ratio of the actual coupling to the "critical coupling" required for maximum power absorption by the odd mode, is extremely small. Under these conditions, the power absorbed in the odd mode resonance is extremely small, and the circuit impedance presented to the diode is essentially unperturbed by this resonance.

Figure 3:
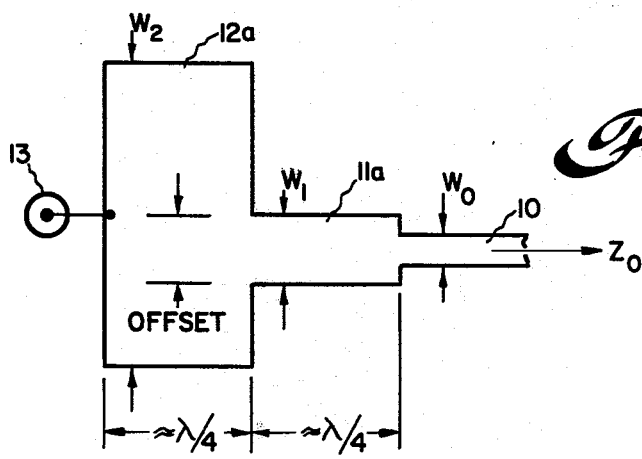
FIG. 3 is a partial plan view of another embodiment of a single Impatt diode broadband amplifier employing an asymmetrical two-section transformer for spurious mode suppression.

FIG. 3 shows another embodiment of a single Impatt diode broadband amplifier employing an asymmetrical two-section transformer for spurious mode suppression. In this simpler approach, the center line of second transformer section 12a is offset by a predetermined distance from the center lines of first transformer section 11a and output transmission line 10. This causes the odd modes of second transformer section 12a to be coupled to the even modes of first transformer section 11a, one of which is the dominant first order propagating mode of the first transformer section. In contrast to the approach in FIG. 1, where the spurious mode to be suppressed is trapped, in FIG. 3 the spurious mode is untrapped so that it passes to the load. This loading causes a significant reduction of the Q of the odd modes of second transformer section 12a. It is believed that the Q will be very low if the offset distance approaches a value equal to $W_2/2$. In this case, assuming that diode 13 is connected to the center line of second transformer section 12a, the input impedance at the diode chip will not be perturbed significantly when the odd mode becomes propagating. Useful impedance matching adjustment is possible by moving the diode off center in one direction or the other to take advantage of the vector addition of even and odd mode fields.

Figure 4:
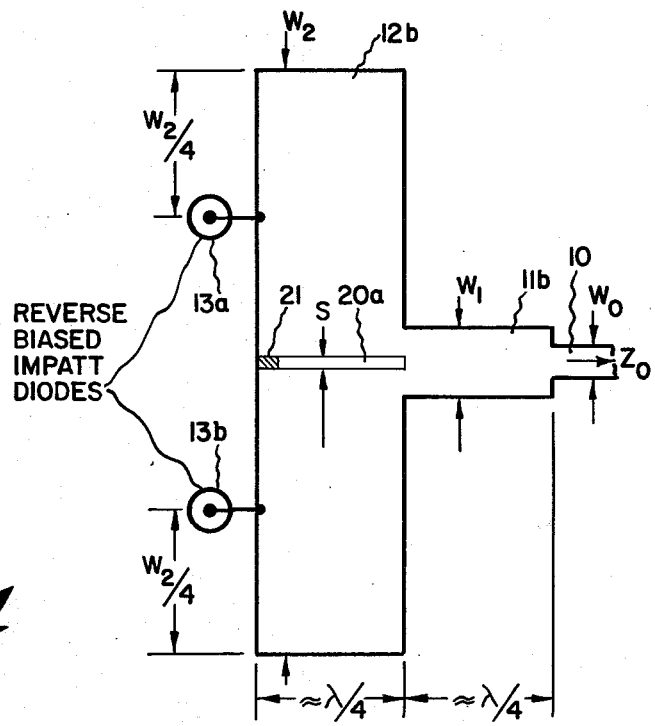
FIG. 4 is a partial plan view of a modification of FIG. 1 for stably combining and amplifying the power of two matched Impatt diodes over a broad frequency range.

FIG. 4 illustrates a compact microstrip configuration for combining and amplifying over a broad frequency band the power from two avalanche diodes operating in the Impatt mode. Two diodes 13a and 13b having reasonably well-matched characteristics are selected, and have corresponding terminals connected symmetrically to an edge of second transformer section 12b spaced transversely from one another, approximately at distances $W_2/4$ from the center line. For this embodiment, which can be described as being a modification of FIG. 1 for two diodes, the relatively wide second transformer section 12b has an open-ended one-quarter wavelength longitudinal slot 20a located centrally of its width dimension with an absorbing resistor bridging the slot for suppressing spurious mode resonance. Absorbing resistor 21 is located at the open end of quarter wavelength slot 20a, with this arrangement of resistor and slot being allowable in this case because the two halves of strip of width $W_2$ are not connected on the diode end of the strip. The other end of the slot is short circuited by first transformer section 11b. In order to accommodate two diodes, assuming that each has a 5 ohm microwave impedance as in the previous example discussed with regard to the configuration of FIG. 1, the width $W_2$ of second transformer section 12b must be made approximately one full wavelength. In this case, three modes can propagate longitudinally in second transformer section 12b, namely, the $EH_0$, $EH_1$ and $EH_2$ modes. These are hybrid modes having both E and H longitudinal fields.

The $EH_0$ mode has even symmetry and is the dominant mode since it has the lowest cut-off frequency, $f_c = f_{co} = 0$. This mode with zero longitudinal variations thus has essentially uniform transverse electric and magnetic field distributions, and is the desired mode of propagation upon which the amplifier matching is based.

The $EH_1$ mode is the lowest order odd mode and starts to propagate when $W_2$ is approximately one-half wavelength. The associated cavity resonance can be designated as the 1, 0 mode resonance because the fields have only a small variation in the longitudinal direction due to the essentially open-circuit boundary condition at the diode connection plane and at the plane of connection between the two transformer sections. The resonance of the $EH_1$ mode will occur at approximately the half frequency and will not be observed within a reasonably wide frequency band near the fundamental or center frequency. The Q of the $EH_1$ mode at resonance is, of course, greatly reduced by the odd mode absorbing resistor 21.

The $EH_2$ mode is the first higher order even mode and starts to propagate when $W_2$ is approximately equal to a full wavelength. The cavity resonance of this mode can be designated as the 2, 0 mode resonance, and can occur within the fundamental frequency band of the amplifier. This mode has two variations of the E field in the transverse direction with the voltage being greatest at the center line of the two-section transformer and zero at distances $W_2/4$ from the center line. The Q of this even mode resonance, however, is low due to the heavy loading provided by first transformer section 11b and output transmission line 10. Furthermore, since the $EH_2$ mode has zero transverse electric fields at the points where diodes 13a and 13b are connected in FIG. 4, the coupling between the diodes and the 2, 0 mode cavity resonance is extremely small. For these reasons, the onset of propagation of the $EH_2$ even mode does not result in a significant perturbation of the input impedance at the diode chip.

Since all propagating modes have been considered, and substantial absorption has been provided for these modes at their resonant frequencies, it follows that the input impedance of the cavity configuration of FIG. 4 is free of anomalies. The magnitude of the so-called junction effects associated with the desired $EH_0$ mode in connection with all of the embodiments has been considered due to the fact that the widest microstrip width $W_2$ is not small relative to a wavelength. However, experimental results can be interpreted as being strong evidence that junction effects are not too significant. The embodiment of FIG. 4 is particularly advantageous since it combines the power from two diodes with broadband impedance matching and spurious mode suppression in a compact structure.

While the invention has been particularly shown and described with reference to several preferred embodiments thereof, it will be understood by those skilled in the art that various changes in form and details may be made without departing from the spirit and scope of the invention.

The invention claimed is:

1. A broadband microwave semiconductor diode amplifier comprising
   a dielectric substrate having a continuous conductive ground plane on one major surface and, on the other major surface, a two-section microstrip impedance transformer comprising first and second quarter wavelength sections at a selected microwave frequency, said first transformer section being coupled to an output microstrip transmission line having a predetermined characteristic impedance,
   a microwave semiconductor diode means connected symmetrically to an edge of said second transformer section,
   said first and second transformer sections each having respective width dimensions selected to match the impedance of said microwave diode means to the output line impedance with the width of said second transformer section being at least approximately one-half wavelength, said two section transformer further having a longitudinal slot located centrally of the width dimension and an absorbing resistor bridging the slot for suppressing spurious mode resonance, and
   means for biasing said microwave diode means and transmitting input signals and amplified output signals.

2. The broadband amplifier according to claim 1 wherein said microwave diode means is a single diode which is connected centrally at the edge of the second transformer section, and said centrally located slot has a length of approximately one-half wavelength and a width narrow as compared to the width dimensions of said two-section transformer.

3. The broadband amplifier according to claim 1 wherein said microwave diode means is a single avalanche diode operable in the Impatt mode which is connected centrally at the edge of said second transformer section, and said centrally located slot has a length of approximately one-half wavelength and a width narrow as compared to the width dimensions of said two-section transformer.

4. The broadband amplifier according to claim 3 wherein said absorbing resistor is mounted substantially at the center of the longitudinal slot.

5. The broadband amplifier according to claim 1 wherein said microwave diode means is comprised by a pair of substantially matched diodes which are connected symmetrically at the edge of the second transformer section spaced transversely from one another, and said longitudinal slot is open-ended and has a length of approximately one-quarter wavelength and a width narrow as compared to the width dimensions of said two-section transformer, said quarter wavelength slot being located centrally of said second transformer section.

6. The broadband amplifier according to claim 1 wherein said microwave diode means is comprised by a pair of substantially matched avalanche diodes each operable in the Impatt mode which are connected symmetrically at the edge of said second transformer section spaced transversely from one another, and said longitudinal slot is open-ended with a length of approximately one-quarter wavelength and a width narrow as compared to the width dimensions of said two-section transformer, said quarter wavelength slot being located centrally of said second transformer section.

7. The broadband amplifier according to claim 6 wherein said absorbing resistor is mounted substantially at the open end of said quarter wavelength slot.

8. A power combiner and broadband avalanche diode amplifier comprising
   a dielectric substrate having a continuous conductive ground plane on one major surface and, on the other major surface, a two-section microstrip impedance transformer comprising first and second quarter wavelength sections at a selected microwave frequency, said first transformer section being coupled to an output transmission line having a predetermined characteristic impedance,
   a pair of avalanche diodes operable in the Impatt mode that have substantially matched diode characteristics and have corresponding terminals connected symmetrically to an edge of said second transformer section spaced transversely from one another, said first and second transformer sections each having respective width dimensions selected to match the diode impedance of said pair of avalanche diodes to the substantially higher output line impedance with the width of said second transformer section being at least approximately one wavelength, said second transformer section further having an open-ended one-quarter wavelength longitudinal slot located centrally of the width dimension and an absorbing resistor bridging the slot for suppressing spurious half-wave odd mode resonance, and means for reverse biasing each avalanche diode, and input-output means for transmitting input signals and isolated amplified output signals.

9. The power combiner and broadband amplifier according to claim 8 wherein said one-quarter wavelength slot has a width narrow as compared to the width dimension of said second transformer section and said absorbing resistor is mounted at the open end of said slot.

10. A broadband microwave semiconductor diode amplifier comprising a dielectric substrate having a continuous conductive ground plane on one major surface and, on the other major surface, an asymmetrical two-section microstrip impedance transformer comprising first and second quarter wavelength sections at a selected microwave frequency, said first transformer section being coupled at the center line thereof to an output microstrip transmission line having a predetermined characteristic impedance, a microwave semiconductor diode having a terminal connected to an edge of said second transformer section at the center line thereof, said first and second transformer sections each having respective width dimensions selected to match the impedance of said microwave diode to the substantially higher output line impedance with the width of said second transformer section being at least approximately one-half wavelength, the center lines of said first and second transformer sections being offset a predetermined distance to cause coupling of spurious odd modes of the second transformer section to desired propagating even modes of the first transformer section and thereby effect suppression of spurious mode resonance, and means for biasing said microwave diode and for transmitting input signals and isolated amplified output signals.

11. The broadband amplifier according to claim 10 wherein said microwave diode is an avalanche diode operable in the Impatt mode and said biasing means applies a reverse bias to said avalanche diode.

* * * * *